US010709036B2

(12) United States Patent
Tsorng et al.

(10) Patent No.: US 10,709,036 B2
(45) Date of Patent: Jul. 7, 2020

(54) REMOVABLE PSU DEDICATED TUNNEL FOR AIR FLOW MECHANISM

(71) Applicant: QUANTA COMPUTER INC., Taoyuan (TW)

(72) Inventors: Yaw-Tzorng Tsorng, Taoyuan (TW); Shih-Hsuan Hu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/260,995

(22) Filed: Jan. 29, 2019

(65) Prior Publication Data

US 2020/0084910 A1 Mar. 12, 2020

Related U.S. Application Data

(60) Provisional application No. 62/729,607, filed on Sep. 11, 2018.

(51) Int. Cl.
*H05K 7/02* (2006.01)
*H05K 7/20* (2006.01)
*H05K 5/02* (2006.01)
*H05K 7/14* (2006.01)

(52) U.S. Cl.
CPC ....... *H05K 7/20136* (2013.01); *H05K 5/0256* (2013.01); *H05K 7/1487* (2013.01); *H05K 7/1489* (2013.01)

(58) Field of Classification Search
CPC ............. H05K 7/20136; H05K 7/1487; H05K 7/1489; H05K 5/0256; H05K 7/20563; H05K 7/20727; H05K 7/20145

USPC ................ 361/679.49–679.51, 695; 454/184
See application file for complete search history.

(56) References Cited

U.S. PATENT DOCUMENTS

| | | | | | |
|---|---|---|---|---|---|
| 5,831,847 | A | * | 11/1998 | Love | H02M 3/00 363/141 |
| 5,940,274 | A | * | 8/1999 | Sato | H05K 7/1488 312/223.2 |
| 6,735,080 | B1 | * | 5/2004 | Chang | G11B 33/124 361/690 |
| 6,856,508 | B2 | * | 2/2005 | Rabinovitz | G06F 1/184 248/682 |
| 6,958,906 | B2 | * | 10/2005 | Wu | G06F 1/20 165/80.1 |
| 7,423,871 | B2 | * | 9/2008 | Schwab | H05K 7/20918 165/104.33 |
| 7,675,749 | B2 | * | 3/2010 | Su | H05K 7/20909 361/695 |

(Continued)

FOREIGN PATENT DOCUMENTS

TW M503738 U 6/2015

OTHER PUBLICATIONS

Extended European Search Report for EP Application No. 19185476. 9, dated Jan. 20, 2020.

(Continued)

*Primary Examiner* — William H. Mayo, III
(74) *Attorney, Agent, or Firm* — Nixon Peabody LLP

(57) ABSTRACT

A dedicated airflow tunnel can extend directly from a front side of the chassis to a power supply unit (PSU) located near the rear side of the chassis. The dedicated airflow tunnel is removable and replaceable with airflow tunnels of different size. The dedicated airflow tunnel can avoid recirculation of PSU cooling air.

14 Claims, 5 Drawing Sheets

(56) References Cited

U.S. PATENT DOCUMENTS

| | | | | |
|---|---|---|---|---|
| 8,077,455 B2* | 12/2011 | Jian | ................ | G06F 1/189 |
| | | | | 248/906 |
| 8,238,117 B2* | 8/2012 | Burwell | ................ | G08B 25/14 |
| | | | | 361/752 |
| 8,462,505 B2* | 6/2013 | Nagami | ................ | B23K 9/1006 |
| | | | | 165/104.33 |
| 2004/0201957 A1 | 10/2004 | Wu et al. | | |
| 2006/0023420 A1 | 2/2006 | Tucker et al. | | |
| 2007/0133167 A1 | 6/2007 | Wagner et al. | | |
| 2014/0063721 A1 | 3/2014 | Herman et al. | | |
| 2015/0124405 A1 | 5/2015 | Lee | | |
| 2016/0231791 A1 | 8/2016 | Peng et al. | | |
| 2019/0098788 A1* | 3/2019 | Leigh | ................ | H05K 7/1445 |

OTHER PUBLICATIONS

TW Office Action for Application No. 108109204, dated Dec. 31, 2019, w/ First Office Action Summary.

* cited by examiner

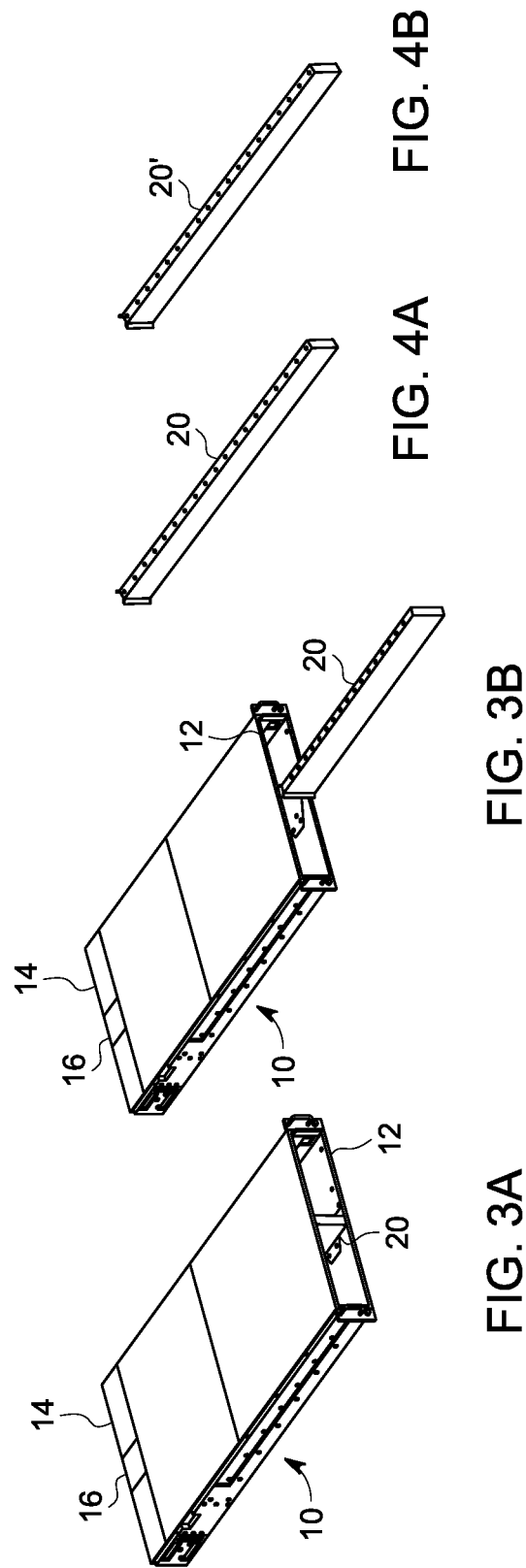

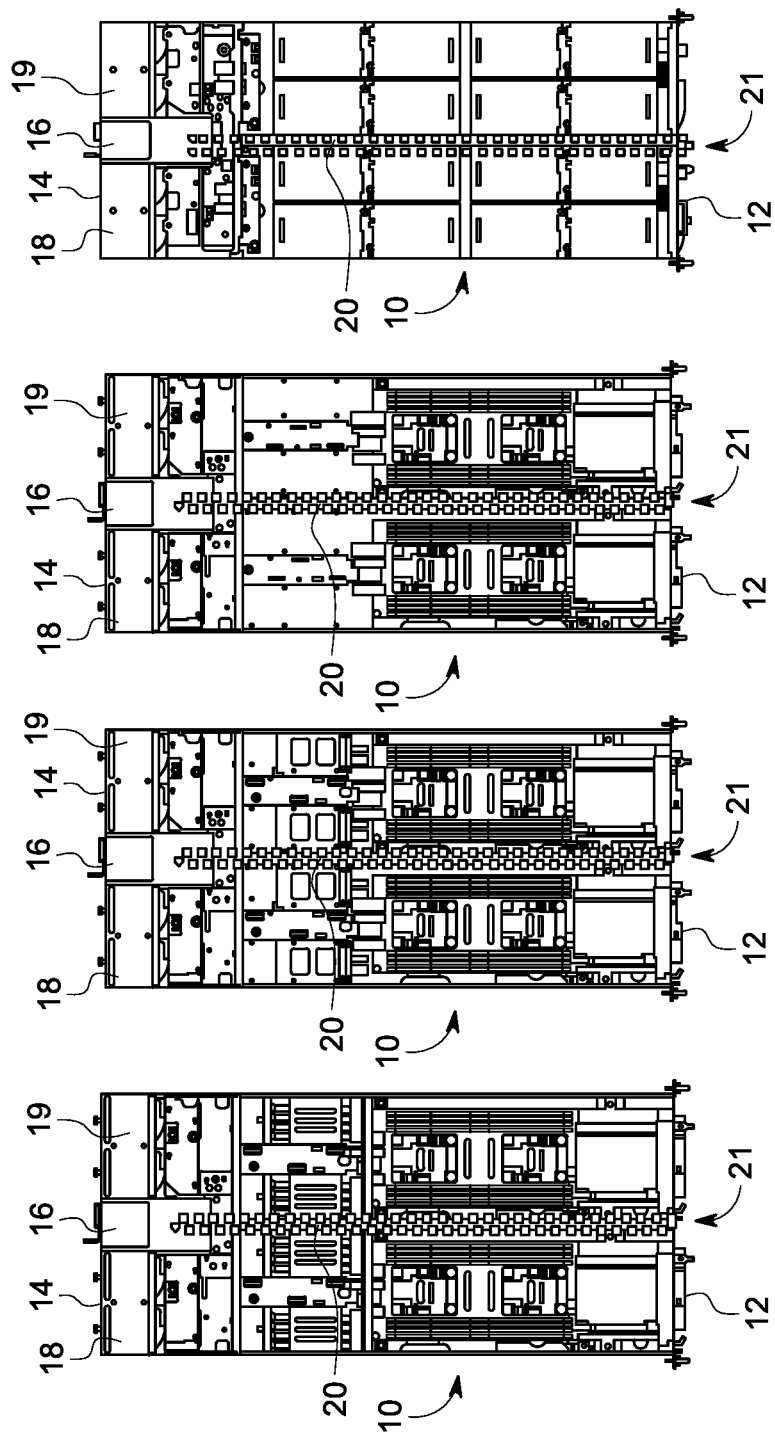

REMOVABLE PSU DEDICATED TUNNEL FOR AIR FLOW MECHANISM

CROSS-REFERENCE TO RELATED APPLICATIONS

This application claims priority under 35 U. S. C. § 119 to U.S. Provisional Application Ser. No. 62/729,607, entitled "REMOVABLE PSU DEDICATED TUNNEL FOR AIR FLOW MECHANISM," and filed Sep. 11, 2018. The contents of that application are herein incorporated by reference.

TECHNICAL FIELD

In order to cool a power supply unit (hereinafter "PSU") directly and obtain the best thermal efficiency, an airflow tunnel is provided to direct clean airflow from the front side of a chassis holding the PSU to rear side of the chassis, by action of the PSU's fan. This design avoids fan recirculation of PSU cooling air. The dedicated airflow tunnel is removable and can utilize one or more brackets to position the removable airflow tunnel with the chassis. In some case straps, tie-downs or the bracket itself can secure the airflow tunnel to the chassis. Different PSU dedicated airflow tunnels can be installed on the same chassis to provide different airflow solutions for a different arrangement of, or a different type of, components within the chassis.

BACKGROUND

Power is typically provided in a computing device via one or more PSU. Generally, these are attached to or mounted within the chassis of the computing device. Such PSUs typically have a cooling fan incorporated as a component of the PSU design. The cooling fan associated with the PSU is located at the rear side of a chassis in which the PSU is placed. Cooling air enters from the front side of the chassis and is drawn from the front to the rear side of the chassis by the PSU cooling fan. However, in some cases there may be impediments within the chassis that prevent direct air flow to the PSU. In still other cases, the air flow used to cool the PSU may be recirculated to the chassis, but at the cost of reduced cooling efficiency. In other cases, different PSUs may be located in a single chassis. In this case, the differently designed PSUs may also have different cooling fan components and different thermal requirements.

In view of the foregoing, there is a need to provide some mechanism to enhance cooling in a chassis to address and meet the various thermal functions for different components and arrangements in a chassis. Also needed is a mechanism that can provide a clean airflow passage from front side to rear side of the chassis, so as to avoid fan recirculation and minimize other airflow impediments for the PSU.

SUMMARY

It is therefore an object of this disclosure to provide an airflow tunnel to direct a source of cooling air directly from the front side of the chassis to the PSU within the chassis, in order to obtain the best thermal efficiency in cooling the PSU. Therefore, in one embodiment, we provide a chassis comprising at least one power supply unit (PSU) and at least one dedicated airflow tunnel within the chassis to define at least one passage between the PSU and the exterior of the chassis.

It is a further object of this disclosure to provide a removable airflow tunnel that can be positioned at any desired location in the chassis to direct a source of cooling air directly from the front side of the chassis to the PSU within the chassis. Therefore, in one embodiment, we provide a kit comprising a chassis of a height to accommodate power supply units (PSU) of different heights, at least one PSU associated with the chassis; and at least two dedicated airflow tunnels of different sizes to bring cooling air directly from a front side of the chassis to the at least one PSU.

It is a still further object of this disclosure to provide removable airflow tunnels of different dimensions or capacity to direct a source of cooling air directly from the front side of the chassis to the particular PSU contained within the chassis. Therefore, in one embodiment, we provide a chassis comprising a front side and a rear side; the chassis further comprising at least one power supply unit (PSU) therein, the PSU being located at a rear side of the chassis; and at least one dedicated airflow tunnel located within the chassis, the at least one dedicated airflow tunnel extending from the front side of the chassis to the PSU It is still a further object of this disclosure to provide a bracket to locate the removable airflow tunnel to secure it to the chassis.

These and other objects of the disclosure be better understood when read in conjunction with the appended drawings and the detailed description.

BRIEF DESCRIPTION OF THE DRAWINGS

FIG. 3A is a schematic view of a chassis and PSU with its associated PSU cooling fan and a removable airflow tunnel in an installed position.

FIG. 3B is a schematic view of the chassis and PSU of FIG. 3A with the removable airflow tunnel removed from the chassis.

FIG. 4A is a schematic view of a first PSU airflow tunnel of a width of about 16.2 mm.

FIG. 4B is a schematic view of a second PSU airflow tunnel of a width of about 7.4 mm.

FIG. 5A is a top view of a chassis that contains a dual node NVMe flash storage (Intel).

FIG. 5B is a top view of a chassis that contains a dual node SSD flash Storage (Intel).

FIG. 5C is a top view of a chassis that contains a dual node Computing Storage (Intel).

FIG. 5D is a top view of a single node standard storage (Intel) platform.

DETAILED DESCRIPTION

Figure 1:
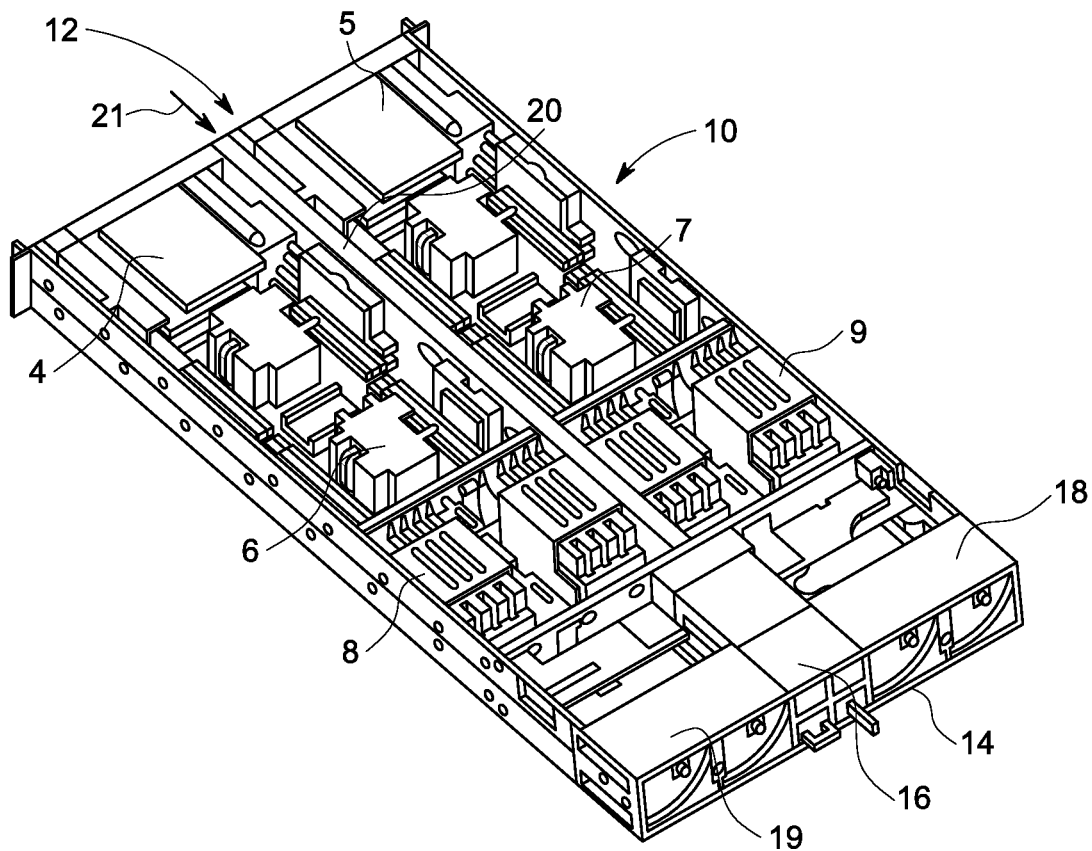
FIG. 1 is a perspective view of a chassis containing a PSU and its associated PSU cooling fan with a removable airflow tunnel of this disclosure.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. Those skilled in the art will appreciate that not every element is visible in each figure of the drawings. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

The present disclosure describes the provision of removable airflow tunnels that can be placed, and removably secured within a chassis, for the purpose of directing air flow from the front side of the chassis directly to a PSU located at the rear side of the chassis. The PSU will have associated as a component thereof PSU cooling fans located at the rear side of the chassis adjacent the PSU.

FIG. 1 schematically illustrates, in perspective view, a chassis 10 having a front side 12 and a rear side 14. Located within the chassis 10, near the rear side 14, is a PSU 16. The PSU 16 is associated with PSU cooling fan 18. Removably located within chassis 10 is a dedicated airflow tunnel 20 extending from the front side 12 of chassis 10 to deliver cooling air to PSU 16. Dedicated airflow tunnel 20 defines a flow channel therein permitting cooling air (shown by arrow 21) to be drawn from front side 12 of chassis 10, and to be confined within dedicated airflow tunnel 20 until the cooling air impinges directly on PSU 16. A cooling fan (which may be a single unit or multiple, individual units 18, 19 provides the pressure drop across the length of the chassis 10 to draw the cooling air 21 into dedicated airflow tunnel 20.

In some embodiments, the dedicated airflow tunnel 20 can be formed of any non-porous material, such as metal or plastic, in order to confine the entire volume of cooling air 21 entering dedicated airflow tunnel 20, so as to deliver the cooling air 21 to PSU 16 without loss of any volume or cooling capacity of cooling air 21. In a configuration where the dedicated airflow tunnel 20 is non-porous, this non-porous construction prevents any cooling air from escaping the confines of the dedicated airflow tunnel 20 or the drawing of any air, which may be preheated, from other electronic components of the chassis 10 into the dedicated airflow tunnel 20. Other components within chassis 10 may include servers or other electronic components, such as central processing units ("CPUs") 4, 5; storage devices 6, 7, such as solid state flash storage devices and/or non-volatile memory express flash storage devices; or other electronic components 8, 9. It should be expressly understood that the other components within chassis 10 are not part of the invention and not-limiting of the electronic components that could be incorporated into chassis 10. What is important is that the cooling air 21 entering from the front side 12 of chassis 10 is directed to the PSU, without significant reduction of airflow or significant heating of the airflow due to permitting excessive cooling air to escape from dedicated airflow tunnel 20, or permitting excessive heated air to enter into dedicated airflow tunnel 20, respectively. Thus, in some embodiments, the dedicated airflow tunnel 20 need not be completely non-porous. Further, in other embodiments, the dedicated airflow tunnel 20 could be insulated.

Figure 2:
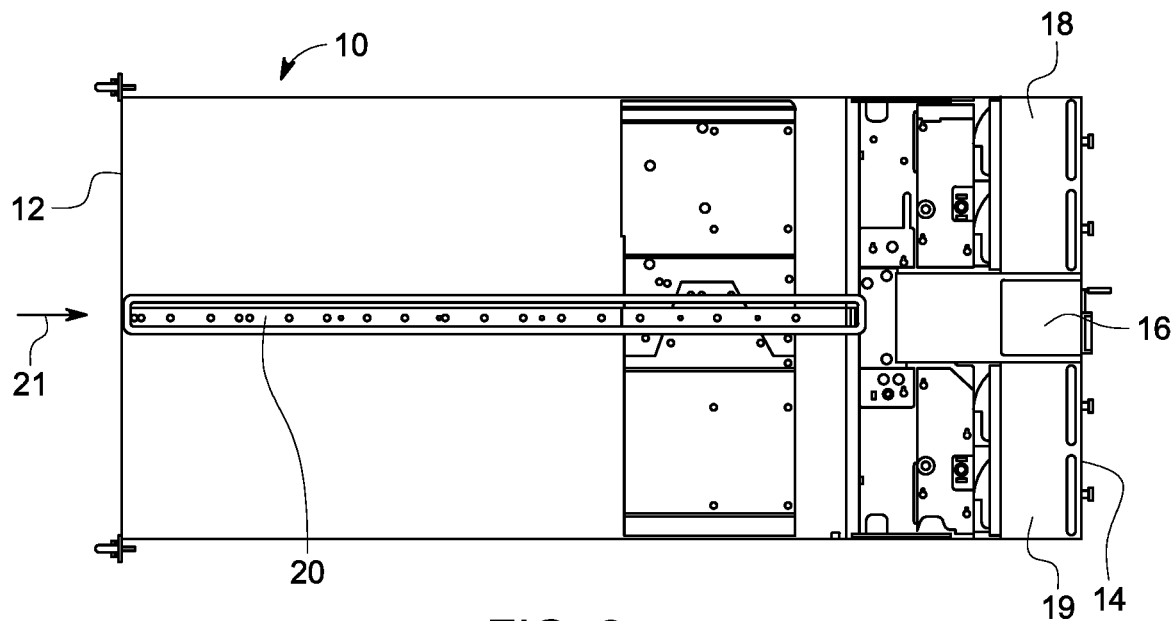
FIG. 2 is a top view of FIG. 1.

FIG. 2 is a top view of FIG. 1 and shows the relative locations of dedicated airflow tunnel 20 in relation to PSU 16. Notwithstanding the presence of other electronic components within chassis 10, airflow tunnel 20 permits the cooling air 21 drawn in from front side 12 of chassis 10 to be delivered directly to PSU 16.

Although dedicated airflow tunnel 20 is illustrated in FIGS. 1 and 2 (and the remaining figures) as defining a single passage for airflow 21, the various embodiments are not limited in this regard. Rather, in some embodiments, the dedicated airflow tunnel 20 can be configured to define multiple passages for airflow 21 from the PSU to a front side 12 of the chassis 10. Moreover, the passages can extend to multiple points along the front side 12 of chassis 10. In other embodiments, more than one dedicated airflow tunnel can be used in chassis, each defining one or more passages.

FIG. 3A is a schematic illustration of airflow tunnel 20 installed within chassis 10, as seen from the front side 12 of chassis 10. FIG. 3B is a schematic illustration of airflow tunnel 20 partially removed from the chassis 10, as seen from the front side 12 of chassis 10.

As shown in FIGS. 3A and 3B, the airflow tunnel 20 and the chassis 10 can be configured to allow the airflow tunnel 20 to be slidably inserted into the chassis 10. However, in other embodiments, insertion of the airflow tunnel 20 can require removal of portions of the chassis 10 to insert the airflow tunnel 20. For example, although airflow tunnel 20 is illustrated as a member substantially extending in a linear direction, in other embodiments, the airflow tunnel 20 may not extend linearly; and may require more careful positioning within the chassis 10, and thus access to the interior of the chassis. In another example, the airflow tunnel 20 may be constructed with one or more flexible portions. In that case, the airflow tunnel 20 again may require more careful positioning within the chassis 10, and thus access to the interior of the chassis. Additionally, the present disclosure recognizes that there may be multiple ways to secure the airflow tunnel 20 to the chassis 10 (e.g., slots, straps, tie-downs). Thus even if the airflow tunnel 20 is substantially linear, access to the interior of the chassis 10 may still be required to secure the airflow tunnel 20 in a correct position.

As discussed above, the airflow tunnel 20 may vary in size and shape depending the configuration of the components in the chassis 10. This is illustrated in FIGS. 4A and 4B. FIG. 4A is a schematic illustration of dedicated airflow tunnel 20 of a first size of 16.2 mm in width. The length of dedicated airflow tunnel 20 in FIG. 4A is sufficient to extend from the front side 12 of chassis 10, shown in FIG. 3A, directly to PSU 16. FIG. 4B is a schematic illustration of a second dedicated airflow tunnel 20' of a size different than dedicated airflow tunnel 20 of FIG. 4A. In FIG. 4B, the width of the dedicated airflow tunnel 20' is 7.4 mm. The length of dedicated airflow tunnel 20' in FIG. 4B is sufficient to extend from the front side 12 of chassis 10 directly to PSU 16. It should be expressly understood that the dimensions of the dedicated airflow tunnel 20 and 20' can vary dependent on the ambient temperature of the cooling air at the front side of the chassis, the cooling requirements of the PSU, the displacement volume of the associated PSU fans, and other variables. Thus, the foregoing dimensions given for airflow tunnel 20 and airflow tunnel 20' are merely exemplary and not limiting.

The volume of air flowing through dedicated airflow tunnel 20 in FIG. 4A or dedicated airflow tunnel 20' in FIG. 4B will be dependent on the cross-section of the hollow space within the dedicated airflow tunnel 20. The speed of the PSU's fans 18, 19 also controls the flow rate of the cooling air 21 through dedicated airflow tunnel 20. Thus, the volume per unit time of air passing through dedicated airflow tunnel 20 can be calculated by multiplying the cross sectional area of the hollow space within dedicated airflow tunnel 20 by the flow rate of the cooling air. While we have illustrated the cross-sectional shape of the dedicated airflow tunnels as rectangular, this illustration is by way of example only. The cross-sectional shape of the dedicated airflow tunnels can be of any cross-section or design provided that it permits and directs sufficient cooling air directly to the PSU.

Thus, in addition to any width differences, as in FIGS. 4A and 4B, the airflow can also vary depending on height differences. In some cases, these height differences can be driven by the types of components in chassis 10. For example, for a typical Intel platform, the arrangement of components permits the dedicated airflow tunnel 20 to be 2U in height.

FIGS. 5A to 5D schematically illustrate various configurations of a chassis in which the embodiments of the disclosure of dedicated airflow tunnels can be combined For example, FIG. 5A is a top view of a dual node non-volatile memory express ("NVMe") flash storage (Intel 2U platform).

FIG. 5B is a top view of a dual node solid state drive ("SSD") flash storage (Intel 2U platform).

FIG. 5C is a top view of a dual node computing storage (Intel 2U platform).

FIG. 5D is a top view of a single node standard storage chassis (Intel 2U platform).

In each of FIGS. 5A through 5D, a dedicated airflow tunnel 20 extends from the front side 12 of chassis 10 directly to the PSU 16 located at the rear side 14 of chassis 10. In each case, the dedicated airflow tunnel 20 brings cooling air 21 from the front side of chassis 10 directly to the PSU 16 under the influence of the pressure drop caused by one or more of the PSU fans 18, 19. Although FIGS. 5A-5D and other embodiments are described in terms of specific platforms or computing device configurations, this is solely for ease of illustration. Accordingly, the various embodiments are not limited to use with only the configurations of computing devices discussed herein.

Figure 6:
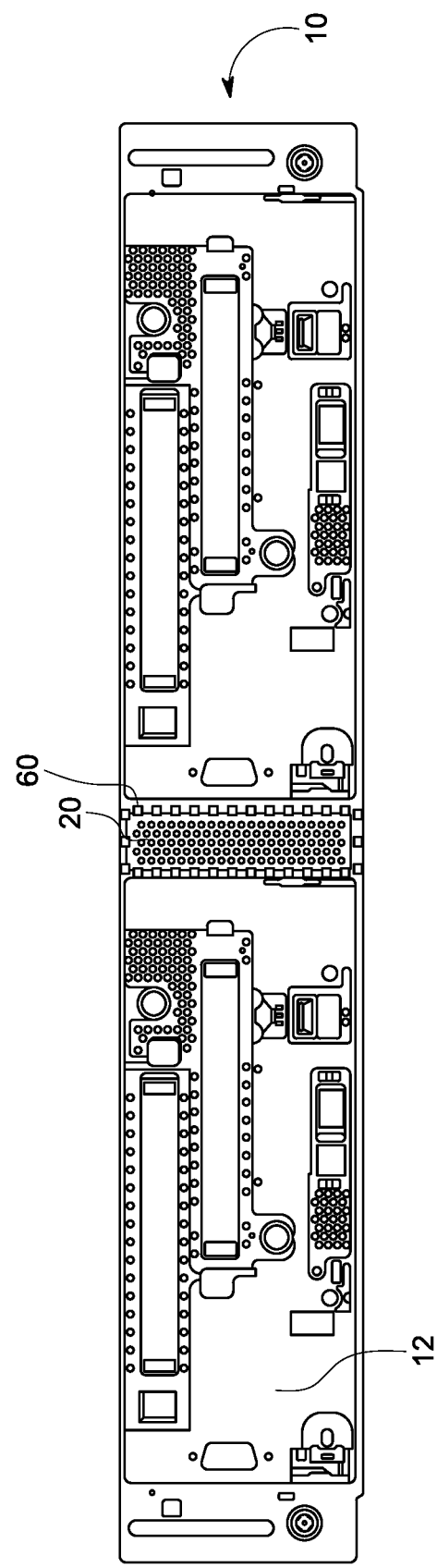
FIG. 6 is a front view of a chassis.

FIG. 6 is a front view of chassis 10. The dedicated airflow tunnel 20 can be covered by a grille or screen 60 through which cooling air 21 can enter into the dedicated airflow tunnel 20 to impinge directly on the PSU 16. Screen 60 is removable to expose dedicated airflow tunnel 20, and permit removal and replacement of the dedicated airflow tunnel 20 when desired.

Figure 8:
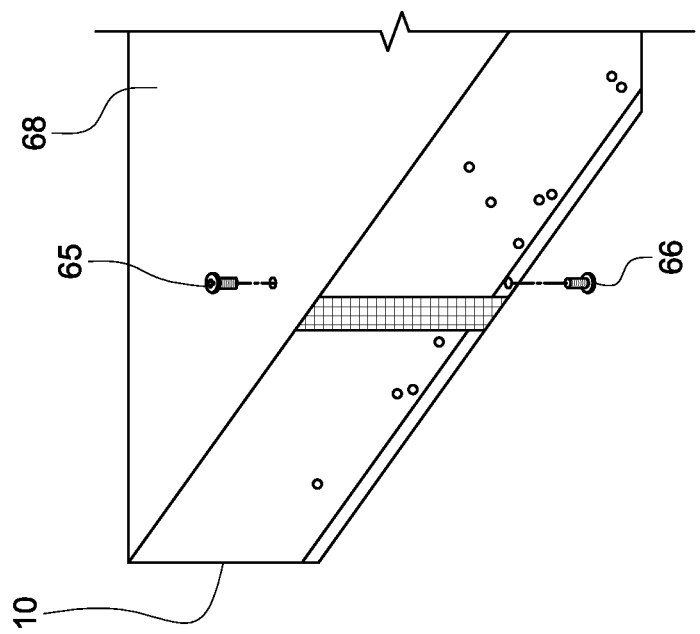
FIG. 8 is a perspective view of a portion of a chassis illustrating the screws passing through the chassis and into the bracket used to position airflow tunnel within the chassis.
Figure 7:
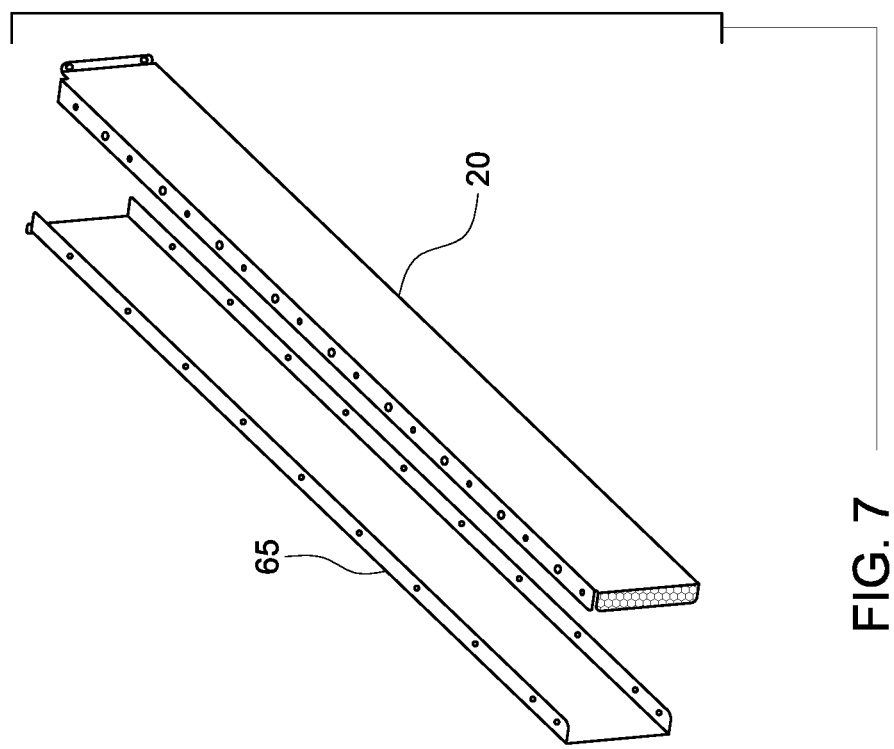
FIG. 7 is a view of a bracket to position a removable airflow tunnel within the chassis.

In order to maintain the position of dedicated airflow tunnel 20 within chassis 10, a single or multiple bracket 65 is shown in relation to airflow tunnel 20 in FIG. 7. This bracket 65 is also removable from chassis 10, thereby permitting relocation of the bracket 65 to a different position on chassis 10; or permitting installation of a different sized dedicated airflow tunnel 20, depending on the desired cooling effect. One or more of a series of screws 65 and 66 may be inserted through the chassis 10 to hold bracket 65 in position. Screws 65 may be inserted through the top 68 of chassis 10 as shown in FIG. 8. A corresponding series of screws 66 may be inserted through bottom of chassis 10 to locate bracket 65 within chassis 10.

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

We claim:

1. A chassis having a front side and a rear side, the chassis comprising:
    at least one power supply unit (PSU) electrically couplable to an electronic component within the chassis, wherein the PSU is positioned at the rear side of the chassis; and
    at least one dedicated airflow tunnel within the chassis to define at least one passage between the PSU and the exterior of the chassis through which cooling air is directed from the exterior of the chassis to the PSU, wherein the electronic component is located outside the passage, and wherein the at least one dedicated airflow tunnel extends from the PSU to the front side of the chassis.

2. The chassis of claim 1, further comprising at least one fan adjacent to the PSU.

3. The chassis of claim 1, wherein the at least one dedicated airflow tunnel is substantially non-porous.

4. The chassis of claim 1, wherein the at least one dedicated airflow tunnel is removable from the chassis.

5. The chassis of claim 1, wherein the at least one dedicated airflow tunnel is linear in length.

6. The chassis of claim 1, wherein the at least one dedicated airflow tunnel is flexible.

7. The chassis of claim 1, wherein the at least one dedicated airflow tunnel comprises multiple openings at the front side of the chassis.

8. The chassis of claim 1, further comprising a removable screen located at the front side of the chassis to permit access to the at least one dedicated airflow tunnel.

9. The chassis of claim 1, further comprising at least one bracket to locate the at least one dedicated airflow tunnel within the chassis.

10. The chassis of claim 1, further comprising at least one from the group consisting of a tie-down, a slot, and a strap to secure the at least one dedicated airflow tunnel within the chassis.

11. The chassis of claim 1, wherein the at least one dedicated airflow tunnel is slidably mounted to the chassis.

12. A kit comprising:
- a chassis of a height to accommodate power supply units (PSU) of different heights, the chassis comprising a front side and a rear side;
- at least one PSU associated with the chassis, wherein the PSU is electrically couplable to an electronic component within the chassis, and wherein the PSU is positioned at the rear side of the chassis; and
- at least two dedicated airflow tunnels of different sizes to bring cooling air directly from a front side of the chassis to the at least one PSU, wherein the electronic component is located outside each of the two dedicated airflow tunnels, and wherein the at least two dedicated airflow tunnels extend from the at least one PSU to the front side of the chassis.

13. The kit of claim 12, wherein each of the at least two dedicated airflow tunnels are linear in length.

14. The kit of claim 12, wherein the at least two dedicated airflow tunnels differ in width.

* * * * *